United States Patent
Hanafi et al.

(10) Patent No.: US 7,512,908 B2
(45) Date of Patent: Mar. 31, 2009

(54) METHOD AND APPARATUS FOR IMPROVING SRAM CELL STABILITY BY USING BOOSTED WORD LINES

(75) Inventors: Hussein I. Hanafi, Basking Ridge, NJ (US); Richard Q. Williams, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 366 days.

(21) Appl. No.: 11/450,610

(22) Filed: Jun. 9, 2006

(65) Prior Publication Data

US 2007/0291528 A1    Dec. 20, 2007

(51) Int. Cl.
*G06F 17/50* (2006.01)
*G06F 9/45* (2006.01)
*G11C 16/06* (2006.01)
*G11C 7/00* (2006.01)
*G11C 8/00* (2006.01)

(52) U.S. Cl. .............. 716/1; 716/4; 716/5; 365/185.23; 365/189.11; 365/230.06

(58) Field of Classification Search .................. 716/1–2, 716/4–5; 365/154, 189.11, 201, 230.06, 365/185.23, 230.03
See application file for complete search history.

(56) References Cited

U.S. PATENT DOCUMENTS

| 4,995,001 | A | 2/1991 | Dawson et al. |
| 5,303,190 | A | 4/1994 | Pelley, III |
| 5,726,944 | A | 3/1998 | Pelley, III et al. |
| 6,470,475 | B2 * | 10/2002 | Dubey ........................... 716/1 |
| 2005/0024917 | A1 | 2/2005 | Yamaoka et al. |
| 2005/0043908 | A1 | 2/2005 | Bhavnagarwala et al. |
| 2005/0141289 | A1 | 6/2005 | Yamaoka et al. |
| 2007/0044049 | A1 * | 2/2007 | Adams et al. .................. 716/4 |

* cited by examiner

*Primary Examiner*—Paul Dinh
(74) *Attorney, Agent, or Firm*—Scully, Scott, Murphy & Presser, P.C.; Ido Tuchman, Esq.

(57) ABSTRACT

The present invention relates to methods and apparatus for improving the stability of static random access memory (SRAM) cells by using boosted word lines. Specifically, a boosted word line voltage (Vdd') is applied to the word line of a selected SRAM cell, while such a boosted word line voltage (Vdd') is sufficiently higher than the power supply voltage (Vdd) of the SRAM cell so as to improve the cell stability to a desired level. Specifically, a specific boosted word line voltage is predetermined for each SRAM cell based on the specific cell configuration, by using a circuit simulation program, such as the BERKELEY-SPICE simulation program. A boost voltage generator is then used to apply the predetermined boosted word line voltage to the selected SRAM cell.

1 Claim, 2 Drawing Sheets

METHOD AND APPARATUS FOR IMPROVING SRAM CELL STABILITY BY USING BOOSTED WORD LINES

FIELD OF THE INVENTION

The present invention relates to methods and devices for improving cell stability of static random access memory (SRAM) cells. More specifically, the present invention uses boosted word line voltages to achieve desired cell stability and static noise margin (SNM).

BACKGROUND OF THE INVENTION

There are two interrelated device parameters to be concerned during SRAM cell design: read stability (hereinafter "stability" or "cell stability") and static noise margin (hereinafter "SNM"). Stability indicates how likely it is to invert the stored value of a SRAM cell when accessing it. SNM refers to the minimum DC noise voltage necessary to flip the state of the cell. Between these two parameters, stability is even more important.

As cell technology is scaled, cell power supply voltage (Vdd) is reduced for the purpose of ensuring proper operation of the complementary metal-oxide-semiconductor (CMOS) device and to minimize stand-by and active power consumptions. In order to maintain good SRAM cell performance with the reduced power supply voltage, it is also desirable to scale the threshold voltages (Vt) of the metal-oxide-semiconductor field effect transistors (MOSFETs) contained by the SRAM cell.

However, Vt variations, especially random Vt variations, do not readily scale with Vt. In general, variations in device characteristics include both systematic variations and random variations. Systematic variations (or process variations) are variations in a manufacturing process that equally affect some or all elements of a local circuit, depending on, for example, the orientation, geometry, and/or location of an element. Systematic variations typically have significant spatial correlations, and elements that are near each other can be expected to have the same or similar amount of systematic variations. Therefore, body-biasing methods can be readily used to compensate for the system variations. In contrast, random variations in device characteristics are uncorrelated. Such random variations can adversely affect circuit behavior even more drastically than systematic variations in circuits such as SRAM cells, and more importantly, they are very difficult to control.

Vt variations between neighboring MOSFETs have major impacts on the stability and SNM of SRAM cells. More specifically, Vt variations between the pass-gate transistors and the pull-down transistors of a SRAM cell can significantly degrade the cell stability, especially when the input and output transition of the pass-gate transistors are rising from a low state (the ground voltage) to a high state (the word line voltage). When the word line is at a high state characterized by the word line voltage, the gate electrodes of the pass-gate transistors are at the same high state with the same word line voltage, and output of the pass-gate transistor is limited by the threshold voltage, i.e., the output is substantially equal to the difference between the word line voltage and the threshold voltage. Therefore, any small variations in the threshold voltage will result in a large variation in the currents that flow through the pass-gate transistors and the pull-down transistors, which in turn leads to reduction in the cell stability.

There is therefore a need for methods and apparatuses that improve cell stability of the SRAM cells. There is also a need for methods and apparatuses that improve SNM of the SRAM cells.

SUMMARY OF THE INVENTION

The present invention employs a boosted word line voltage to improve the cell stability as well as SNM of SRAM cells.

In one aspect, the present invention relates to a method that comprises:

providing multiple SRAM cells that each comprises at least two pull-up transistors, two pull-down transistors, and two pass-gate transistors, wherein each of the transistors comprises a source, a drain, and a gate electrode, wherein a ground line is connected to the sources of the two pull-down transistors of each SRAM cell for applying a ground voltage thereto, a power supply line is connected to the sources of the two pull-up transistors of each SRAM cell for applying a power supply voltage thereto, and a word line is connected to the gate electrodes of the two pass-gate transistors of each SRAM cell; and selecting one out of said multiple SRAM cells by applying a boosted word line voltage to the gate electrodes of the two pass-gate transistors of the selected SRAM cell through the word line of the selected SRAM cell, wherein the boosted word line voltage is sufficiently higher than the power supply voltage so as to achieve a predetermined stability of the selected SRAM cell.

In another aspect, the present invention relates to a semiconductor memory device, comprising multiple SRAM cells and at least one boost voltage generator, wherein each of the SRAM cells comprises at least two pull-up transistors, two pull-down transistors, and two pass-gate transistors, each of the transistors comprising a source, a drain, and a gate electrode, wherein a ground line is connected to the sources of the two pull-down transistors of each SRAM cell for applying a ground voltage thereto, wherein a power supply line is connected to the sources of the two pull-up transistors of each SRAM cell or applying a power supply voltage thereto, wherein a word line is connected to the gate electrodes of the two pass-gate transistors of each SRAM cell, wherein the at least one boost voltage generator is connected at least to the word line of a selected SRAM cell for applying a boosted word line voltage to the gate electrodes of the two pass-gate transistors of the selected SRAM cell, and wherein the boosted word line voltage is sufficiently higher than the power supply voltage so as to achieve a predetermined stability of the selected SRAM cell.

Other aspects, features and advantages of the invention will be more fully apparent from the ensuing disclosure and appended claims.

DETAILED DESCRIPTION OF THE INVENTION, AND PREFERRED EMBODIMENTS THEREOF

In the following description, numerous specific details are set forth, such as particular structures, components, materials, dimensions, processing steps and techniques, in order to provide a thorough understanding of the present invention. However, it will be appreciated by one of ordinary skill in the art that the invention may be practiced without these specific details. In other instances, well-known structures or processing steps have not been described in detail in order to avoid obscuring the invention.

It will be understood that when an element as a layer, region or substrate is referred to as being "on" another element, it can be directly on the other element or intervening elements may also be present. In contrast, when an element is referred to as being "directly on" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

This invention uses a boosted word line voltage to improve the cell stability as well as SNM of SRAM cells.

It has been discovered by the inventors of the present invention that by boosting the word line voltage applied to a selected SRAM cell to a level higher than the power supply voltage of such a SRAM cell, the output-rising delay sensitivity to Vt variations of the pass-gate transistors of the SRAM cell can be effectively reduced. Further, the currents flowing through the pass-gate transistors and the pull-down transistors of the SRAM cell is maintained constant, which improves the cell stability and SNM of the SRAM cell.

Figure 1:
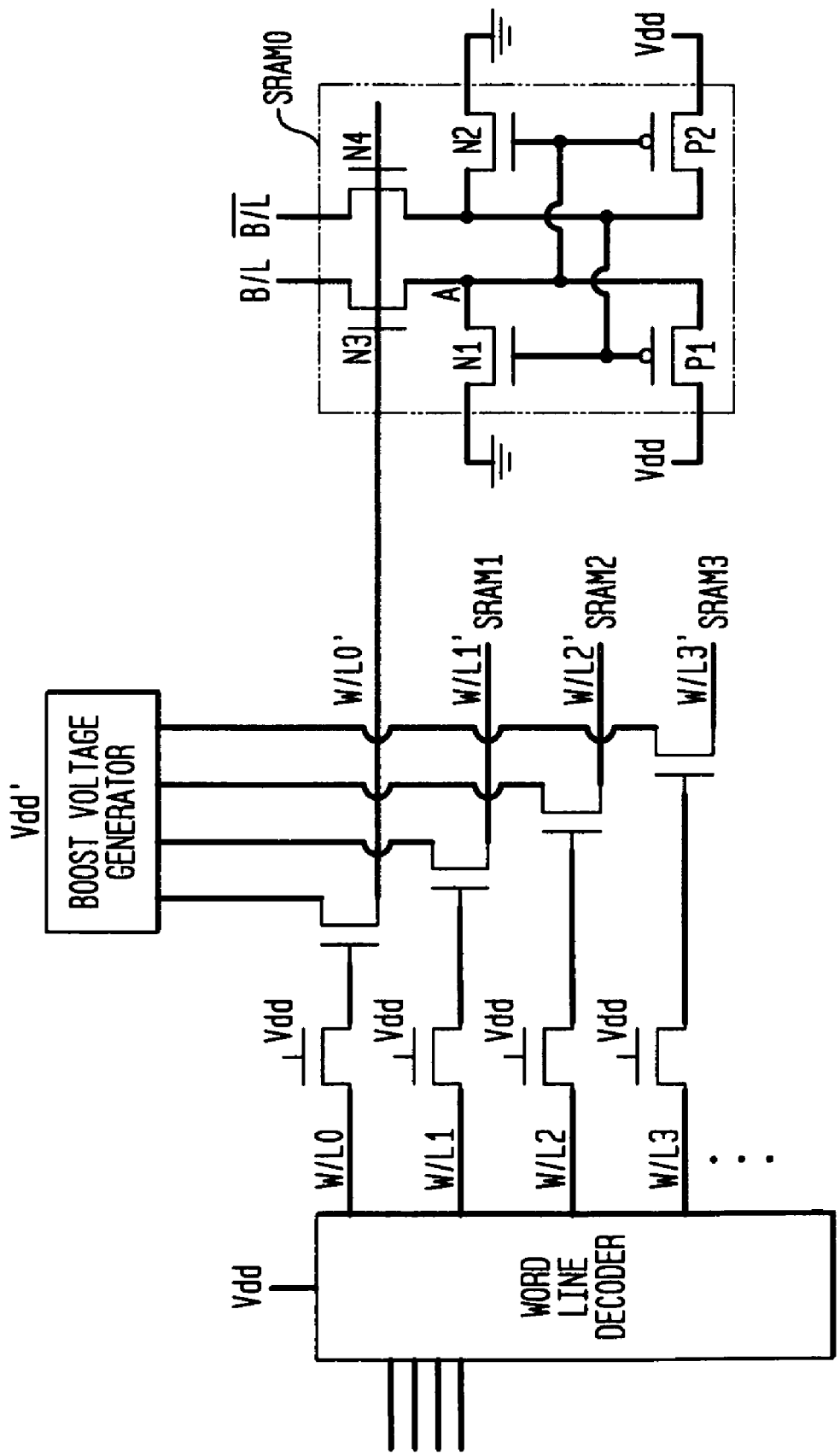
FIG. 1 shows an exemplary semiconductor memory device comprising at least one SRAM cell and at least one boost voltage generator, according to one embodiment of the present invention.

FIG. 1 shows an exemplary semiconductor device that comprises at least one 6T SRAM cell (SRAM0). The SRAM0 cell comprises two pull-up p-channel field effect transistors (p-FETs) P1 and P2, two pull-down n-channel field effect transistors (n-FETs) N1 and N2, and two pass-gate n-FETs N3 and N4. The pull-up and pull-down transistors P1, P2, N1, and N2 form a flip-flop circuit containing two cross-coupled inverters for storing a logic state (0 or 1). The pass-gate transistors N3 and N4 serve to control the access to the SRAM0 cell during read and write operations.

A ground line (not shown) is connected to the sources of the two pull-down transistors N1 and N2, for applying a ground voltage thereto. A power supply line (not shown) is connected to the sources of the two pull-up transistors P1 and P2, for applying a power supply voltage (Vdd) thereto. A word line (W/L0 or W/L0') connects the gate electrodes of the two pass-gate transistors N3 and N4 of the SRAM0 cell with a word line decoder. The word line decoder is also connected to multiple additional word lines, e.g., W/L1 or W/L1', W/L2 or W/L2', W/L3 or W/L3', . . . , which in turn are connected to additional SRAM cells, e.g., SRAM 1, SRAM 2, SRAM3, . . . . Further, the two cross-coupled inverters of the flip-flop circuit formed by P1, P2, N1, and N2 are respectively connected to a pair of bit lines (B/L and $\overline{B/L}$).

To select the cell SRAM0, the word line (W/L0 or W/L0') is selected by increasing the word line voltage to a high state (i.e., Vdd), so that the two pass-gate transistors N3 and N4 are "on" with a word line voltage being applied thereto. During a read operation, the two bit lines (B/L and $\overline{B/L}$) are connected to a sense amplifier (not shown) that recognizes if a logic state "1" or "0" is stored in the selected SRAM0 cell, and the sense amplifier (not shown) then outputs the logic state of the SRAM0 cell. During a write operation, input data is transferred to a write circuitry (not shown) that is connected to the two bit lines (B/L and $\overline{B/L}$). Since the write circuitry drivers are stronger than those of the SRAM0 cell, the input data is forced into the cell.

In conventional SRAM cells, the word line voltage applied to the selected SRAM0 cell is the same as, or substantially equal to, the power supply voltage (Vdd).

In contrast, the present invention employs a boost voltage generator (as shown in FIG. 1) to apply a boosted word line voltage (Vdd') through the word line (W/L0 or W/L0') to the gate electrodes of the two pass-gate transistors N3 and N4. The boosted word line voltage (Vdd') is higher than the power supply voltage (Vdd), which leads to improved cell stability and SNM for the selected SRAM0 cell. Typically, the difference between the boosted word line voltage (Vdd') and the power supply voltage (Vdd) is about 1 to 2 times of Vt, which typically ranges from about 0.1V to about 0.3V. Therefore, when the power supply voltage is about 1 V, the boosted word line voltage preferably ranges from about 1.1V to about 1.6V, although higher boosted word line voltages can also be used in the practice of the present invention without limitation.

The boosted word line voltage (Vdd') as used in the present invention can be readily adjusted for achieving a desired cell stability, depending on the specific configuration of the SRAM cell. For example, for a perfectly matched SRAM cell fabricated using a 90 nm silicon-on-insulator (SOI) process technology and operated at a power supply voltage of about 1 V, the SNM is about 123 mV at an un-boosted word line voltage (i.e., =1 V), but it is increased to about 144 mV at a boosted word line voltage of about 1.1 V. More importantly, the cell stability is significantly improved, from a failure rate of about 1-2 failures per 10 megabit at the un-boosted word line voltage to about $2 \times 10^{-3}$ failures per 10 megabit at the boosted word line voltage, and a constant resistance ration is maintained between the pass-gate transistors and the pull-down transistors of such a CMOS 10 s SRAM cell.

The boosted word line voltage (Vdd') required for achieving the desired cell stability in the present invention can be pre-determined by using a well known circuit simulation program, such as the BERKELEY-SPICE simulation program, the H-SPICE simulation program, the P-SPICE simulation program, and the RF Spectre simulation program. Among the currently available circuit simulation programs, the BERKELEY-SPICE simulation program is preferred. Preferably, a boosted word line voltage from about 1.1 V to about 1.4 V is applied to a 90 nm SRAM cell for achieving a cell stability of less than about $1 \times 10^{-3}$ failures per 10 megabit.

Figure 2:
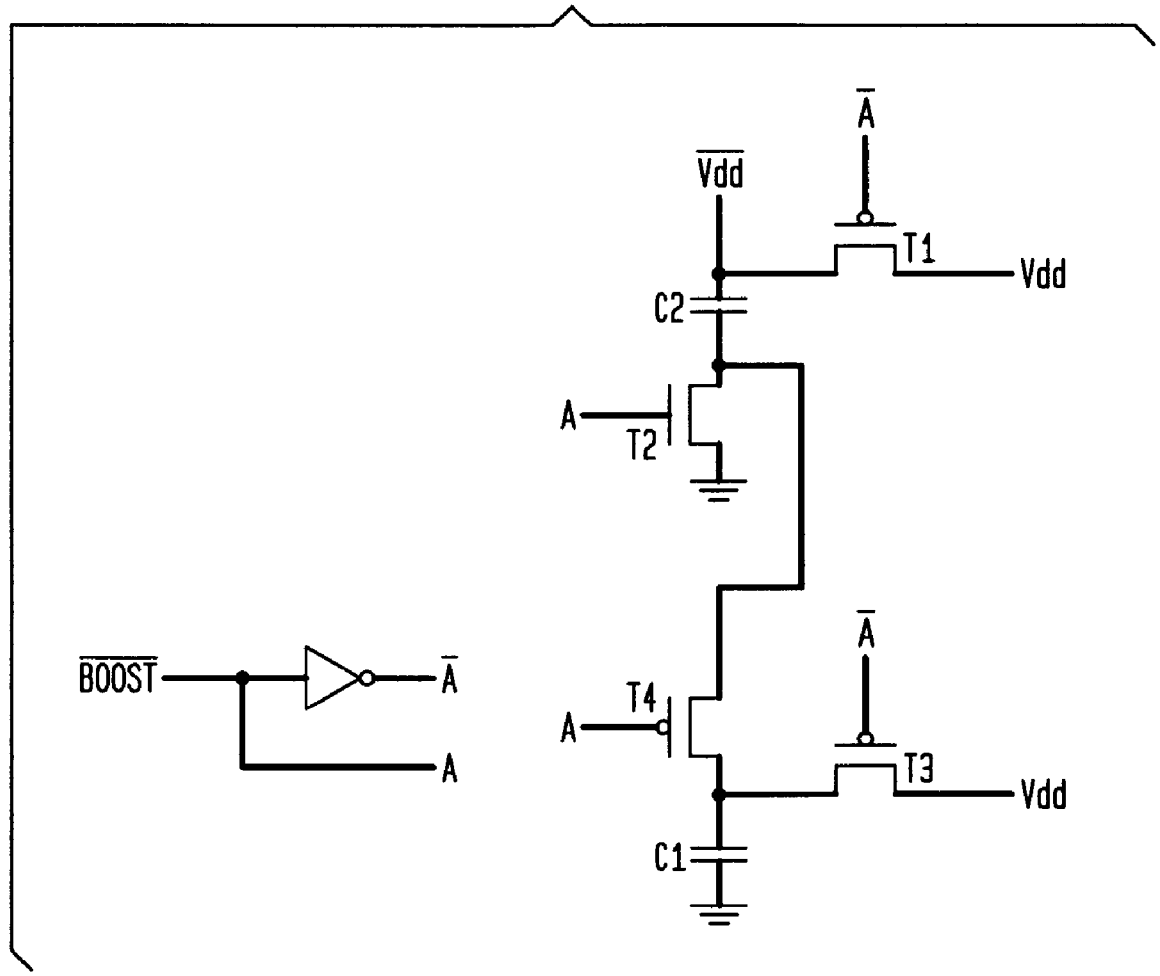
FIG. 2 shows an exemplary boost voltage generator, according to one embodiment of the present invention.

The boost voltage generator employed by the present invention to apply the boosted word line voltage (Vdd') to the selected SRAM cell may comprise any suitable voltage generator well known in the art. FIG. 2 specifically shows an exemplary boost voltage generator, according to a preferred embodiment of the present invention. Specifically, the boost voltage generate comprises four transistors T1-T4 and two capacitors C1-C2 arranged as in FIG. 2. A boost signal voltage ($\overline{Boost}$) determines the gate voltages A and $\overline{A}$ for the transistors T1-T4. Specifically, the gate voltage A is the same as the boost signal voltage ($\overline{Boost}$), while the gate voltage $\overline{A}$ is the invert of the boost signal voltage ($\overline{Boost}$).

For example, when the boost signal voltage ($\overline{Boost}$) is high (i.e., =Vdd), the gate voltage A is also high, but the gate voltage $\overline{A}$ is low (i.e., =ground). Correspondingly, the transistors T2 is "on," while the transistors T1 and T4 are "off." As a result, the capacitors C1 and C2 are charged to full Vdd. When the boost signal voltage ($\overline{Boost}$) becomes low (i.e., =ground), the gate voltage A is also low, but the gate voltage $\overline{A}$ is high (i.e., =Vdd). Correspondingly, the transistors T4 is "on," while the transistors T1, T2 and T3 are "off." As a result, the capacitors C1 and C2 form a series connection that boosts the output node $\overline{Vdd}$ to a voltage Vdd' that is higher than Vdd. The specific value of the voltage Vdd' is determined by the values of the capacitors C1 and C2 as well as the capacitance of the selected word line (e.g., W/L0 or W/L0' of FIG. 1).

Further, the boost voltage generator of the present invention is preferably isolated from the word line decoder by a transistor that is located on the selected word line (W/L0), as shown in FIG. 1. A restored signal voltage substantially equal to the power supply voltage (Vdd-Vt) is applied to the gate electrode of such a transistor on the selected word line (W/L0).

The semiconductor memory devices of the present invention can be fabricated by any suitable method well known in the art, with minimal or no modifications that can be readily determined by a person ordinarily skilled in the art.

While FIGS. 1-2 illustratively demonstrates an exemplary semiconductor memory device and an exemplary boost voltage generator, according to specific embodiments of the present invention, it is clear that a person ordinarily skilled in the art can readily modify the structures illustrated herein, for adaptation to specific application requirements, consistent with the above descriptions. It should therefore be recognized that the present invention is not limited to the specific embodiment illustrated hereinabove, but rather extends in utility to any other modification, variation, application, and embodiment, and accordingly all such other modifications, variations, applications, and embodiments are to be regarded as being within the spirit and scope of the invention.

What is claimed is:

1. A method for improving stability of static random access memory (SRAM) cells, comprising:

providing multiple SRAM cells that each comprises at least two pull-up transistors, two pull-down transistors, and two pass-gate transistors, wherein each of said transistors comprises a source, a drain, and a gate electrode, wherein a ground line is connected to the sources of the two pull-down transistors of each SRAM cell for applying a ground voltage thereto, a power supply line is connected to the sources of the two pull-up transistors of each SRAM cell for applying a power supply voltage thereto, and a word line is connected to the gate electrodes of the two pass-gate transistors of each SRAM cell; and selecting one out of said multiple SRAM cells by applying a boosted word line voltage that ranges from about 1.1 V to about 1.6 V and is predetermined by using the BERKELEY-SPICE simulation program to the gate electrodes of the two pass-gate transistors of the selected SRAM cell through the word line of the selected SRAM cell, wherein the boosted word line voltage is generated by a boosted voltage generator comprising multiple transistors and multiple capacitors and is sufficiently higher than the power supply voltage so as to achieve a predetermined stability of less than about $1 \times 10^{-3}$ failures per 10 megabit in the selected SRAM cell, and wherein a word line decoder is coupled with the word lines of the SRAM cells, and said boost voltage generator is isolated from the word line decode by a transistor located on each of said word lines, and wherein a restored signal voltage substantially equal to the power supply voltage is applied to a gate electrode of said transistor.

* * * * *